United States Patent [19]

Fisher et al.

[11] Patent Number: 5,557,638
[45] Date of Patent: Sep. 17, 1996

[54] TRANSMISSION SYSTEM FOR MULTIVALUED DIGITAL SYMBOLS

[75] Inventors: Kevin D. Fisher, Palo Alto, Calif.; Ho W. Wong-Lam, Eindhoven, Netherlands; Johannes W. M. Bergmans, Eindhoven, Netherlands; Frits A. Steenhof, Eindhoven, Netherlands; Johannes O. Voorman, Eindhoven, Netherlands

[73] Assignee: U.S. Philips Corporation, New York, N.Y.

[21] Appl. No.: 212,669

[22] Filed: Mar. 10, 1994

[30] Foreign Application Priority Data

Mar. 11, 1993 [EP] European Pat. Off. .............. 93200712

[51] Int. Cl.$^6$ ................................................. H04L 25/34
[52] U.S. Cl. ........................ 375/286; 375/264; 375/287; 375/290; 375/345; 341/118; 341/139
[58] Field of Search ..................................... 375/263, 264, 375/286, 287, 290, 317, 340, 345, 351; 341/56, 94, 118, 139; 364/746.2; 455/234.1, 245.1

[56] References Cited

U.S. PATENT DOCUMENTS 4,841,301  6/1989  Ichihara .................... 375/345
4,860,010  8/1989  Iwamatsu ................... 341/118

OTHER PUBLICATIONS

Cideciyan et al., "A PRML System for Digital Magnetic Recording", IEEE Journal on Selected Areas in Communications, vol. 10, No. 1, Jan. 1992, pp. 38–56.

*Primary Examiner*—Stephen Chin
*Assistant Examiner*—Amanda T. Le
*Attorney, Agent, or Firm*—Edward W. Goodman

[57]  ABSTRACT

In a digital transmission system including a transmitter (2) coupled via a channel (4) to a receiver (6) a detection signal $r_k$ is compared with a number of reference values to determine the destination symbols $â_k$. Since the size of the received signal $r_k$ is not known in advance, the ratio between the detection signal and the reference values is to be determined by an adapting circuit (16) on the basis of the received signal and the decisions made. The problem may then occur that as a result of an initially erroneous value of the ratio between detection signal and reference values not a correct adaptation is made. By recognizing such a situation because specific values of the symbols $â_k$ are lacking, in such a situation said ratio can be brought to such a value by the correction circuit (18) that all the values of $â_k$ again occur.

8 Claims, 2 Drawing Sheets

TRANSMISSION SYSTEM FOR MULTIVALUED DIGITAL SYMBOLS

BACKGROUND OF THE INVENTION

1. Field of the Invention

The invention relates to a digital transmission system comprising a transmitter coupled to a receiver by a channel, the receiver comprising deriving means for deriving a detection signal from an input signal received from the channel, a detector for determining detected symbols by comparing the detected signal with at least one reference value, the receiver also including adapting means for adapting the ratio between the amplitude of the detected signal and the reference value to minimize the symbol error rate.

The invention likewise relates to a receiver for such a transmission system.

2. Description of the Related Art

A transmission system as defined in the opening paragraph is known from the journal article "A PRML System for Digital Magnetic Recording" in IEEE Journal on selected Areas in Communications Vol. 10, No. 1, January 1992.

Transmission systems of this type may be used, for example, for transferring digital symbols through the public telephone network, or for reconstructing digital symbols originating from a magnetic tape or disc. When digital source symbols are transmitted via a transmission medium or when data symbols are stored on a recording medium, the digital symbols to be transmitted or recorded, respectively, are convened to analog pulses which are subsequently applied to the transmission medium or recording medium, respectively, further to be denoted by the term of channel.

The input signal of the receiver coming from the channel is convened in the receiver to a detection signal of which it is possible to determine, by a detector which value of a transmitted symbol belongs to the associated value of the detection signal. For the conversion of the input signal to a detection signal, processes such as demodulation, equalization, echo cancelling and amplitude control may be necessary. For reconstructing the transmitted symbols on the basis of the detection signal, it is necessary to compare the current detection signal, reduced, as required, by an estimate of the contributions of the preceding symbols to the detection signal, with one or more reference values. Depending on the relative value of the detection signal with respect to the reference value(s) at a detection instant, a specific symbol value is assigned to the detection signal.

Since the signal loss on the transmission path may present a strong fluctuation, the amplitude of the input signal may differ strongly for different situations. The receiver, however, is to be capable of correctly linking the value of the detection signal and the associated value of the detected symbol, despite the strongly fluctuating amplitude. In the prior-art transmission system, the comparison between detection signal and reference value is made in a Viterbi detector, but it is likewise conceivable to determine the relationship between the detection signal and values of the detected symbols by means of a simple comparator. In a number of situations, the reference values are equal to the average of two successive possible values of the detection signal (supposed to be noise-free here). With such a selection of the reference values; the symbol error rate is minimized for an equal probability of all the symbols.

Since the amplitude of the signal coming from the channel is not known a priori, the optimum value of the reference values cannot be known a priori either and the relationship between the detection signal and reference values is to be determined on the basis of the signal coming from the channel. The adaptation of the relationship between the amplitude of the detection signal and the reference values may be effected in various ways. One option is to determine the amplitude of the detection signal at the desired value with fixed reference values with the aid of a circuit for automatic gain control, further to be referenced AGC amplifier (Automatic Gain Control). An alternative solution is to adapt the reference value(s) to the amplitude of the detection signal.

Said journal article has disclosed that the adaptation of the ratio between the amplitude of the detection signal and the reference value(s) can be effected by making an estimate of the nominal value of the detection signal on the basis of the reference values and a decision about the value of a detected symbol. If the real value of the detection signal is greater than the estimate, the ratio between the amplitude of the detection signal and the reference value is adapted by increasing the reference value or by reducing the amplitude of the detection signal. If the real value of the detection signal is smaller than the estimate, the ratio between the amplitude of the detection signal and the reference value is adapted by reducing the reference value or by increasing the amplitude of the detection signal.

Experiments and simulations have shown that when the ratio between the amplitude of the detection signal and the reference values is adapted in said manner by the adapting means, it may happen that this ratio is adapted to an erroneous value which leads to a very large symbol error rate.

SUMMARY OF THE INVENTION

It is an object of the invention to provide a transmission system as defined in the opening paragraph in which the determination of the ratio between the detection signal and the reference value always leads to a suitable value for this ratio.

For this purpose, the invention is characterized, in that the receiver comprises monitoring means for detecting the absence of at least one of the possible values of the detected symbols and includes correction means for correcting the ratio between the detection signal and the reference value if at least one of the possible values of the detected symbols is absent.

The invention is based on the recognition that an erroneous ratio between the amplitude of the detection signal and the reference value, which ratio leads to a large bit error rate, can then occur and only then occur if at least one of the possible values of the detected symbols is absent. By checking the presence of all the possible symbol values, there may be ascertained, if one or more symbol values are absent, that the ratio between the amplitude of the detection signal and the reference value is incorrect. In addition, depending on which symbol values are lacking, there may be ascertained whether the ratio is too high or too low. On the basis of said information, the ratio can be adapted by the correction means so that all the symbol values again occur.

An embodiment of the invention is characterized in that the receiver is arranged for adapting the ratio between the detection signal and the reference value on the basis of a combination of a correction signal coming from the correction means and an adaptation signal coming from the adapting means.

By adapting the ratio between the amplitude of the detection signal and the reference value on the basis of a combination of the adaptation signal and the correction signal, only little additional hardware and/or software is necessary to make the correction of the ratio between the amplitude of the detection signal and the reference value. The combination of the adaptation signal and the correction signal may be achieved, for example, by adding the correction signal to the adaptation signal.

A further embodiment of the invention is characterized, in that the correction means are arranged for generating a correction signal which, if at least one of the possible values of the detected symbols is absent, changes in a first direction at a rate that is lower than the rate at which the correction signal changes in a direction opposite to the first direction when all the possible values of the detected symbols occur.

A relatively slow increase of the correction signal, if certain symbol values are absent, avoids that if certain symbol values are absent for a brief period of time, the adaptation of the ratio between the amplitude of the detection signal and the reference value is not disturbed by a (an unnecessary) correction. A relatively fast reduction of the correction signal if all the possible symbol values are present, avoids that the correction is made for a longer period of time than is strictly necessary.

A further embodiment of the invention is characterized, in that the number of possible values of the channel symbols to be detected is greater than the number of possible values of the source symbols, in that the detector is are arranged for deriving destination symbols that have the same possible values as the source symbols from the detection signal and in that the monitoring means are arranged merely for detecting the absence of possible values of the destination symbols.

For specific classes of channels, for example, commonly termed partial response channels, the number of possible values of the channel symbols is greater than the number of possible values of the source or destination symbols. It appears to be possible to detect an erroneous ratio between the amplitude of the detection signal and the reference value by only monitoring whether all the possible values of the destination symbols are present. This makes a check whether all possible values of the detection signal are present redundant. It leads to a reduction of the complexity of the monitoring means, because only a smaller number of possible symbol values need to be monitored. In the system, detection means can moreover be used in which the decision about the value of the channel symbols is not made explicitly. This type of detector means may sometimes be simpler than the detection means in which the decision about the value of the symbols coming from the channel is taken explicitly indeed. Several examples of partial response channels are, for example, channels having a transfer function $H(D)=1-D^2$(PRIV) and $H(D)=1+D-D^2-D^3$(EPRIV), in which D is the notation customary in data transmission for a delay over one symbol interval.

BRIEF DESCRIPTION OF THE DRAWINGS

The invention will now be further explained with reference to the drawing Figures, in which.

DESCRIPTION OF THE PREFERRED EMBODIMENTS

Figure 1:
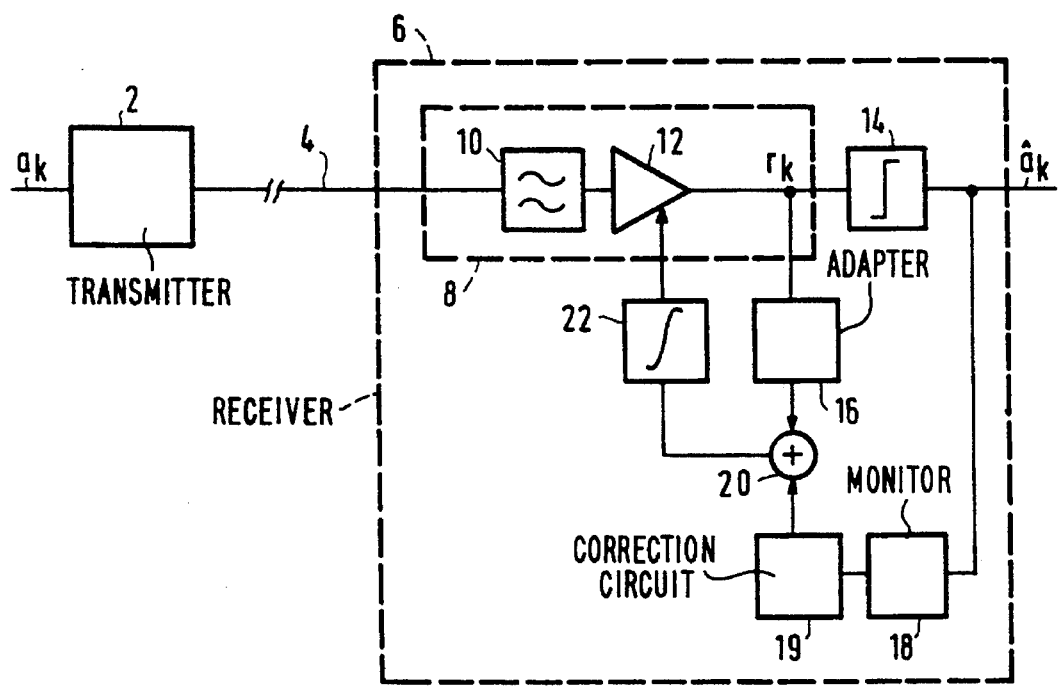
FIG. 1 shows a transmission system according to the invention.

In FIG. 1, source symbols $a_k$ are applied to a transmitter 2. The output of the transmitter 2 is coupled to an input of a channel 4. An output of the channel 4 is coupled to an input of a receiver 6. The received signal in the receiver 6 is applied to the deriving means 8 for deriving the detection signal from the input signal. These deriving means 8 comprise, in this case, a filter 10 and an AGC amplifier 12. The output of the amplifier 12 is connected to an input of detection means 14 and to an input of adaptation means 16. The output of the adaptation means 16 is connected to a first input of an adder circuit 20. The adaptation signal is available on the output of the adaptation means 16. The destination symbols $â_k$ are available on the output of the detection means 14. The output of the detection means 14 is also connected to an input of the monitoring means 18. An output of the monitoring means 18 is connected to an input of the correction means 19. The correction signal is available on the output of the correction means 19. The output of the correction means 19 is connected to a second input of the adder circuit 20. This adder circuit 20 is present for combining the correction signal with the adaptation signal.

The output of the adder circuit 20 is connected to an input of an integrator 22. The output of the integrator 22 is connected to a control input of the AGC amplifier 12.

The transmission system shown in FIG. 1 is arranged for transmitting quinary digital symbols. There is assumed that these symbols $a_k$ may adopt the values $-4, -2, 0, +2$ and $+4$, while k is a running index which adopts successive integral values. After filtering by the filter 10 and amplification of the filtered signal, the detection signal $r_k$ is present at the input of the detection means 14. The following may then be written for the detection signal:

$$r_k = w \cdot a_k + n_k \qquad (1)$$

In (1), w is the amplitude transfer factor of the combination of the channel and the deriving means 8, and $n_k$ is the instantaneous value of the noise component in $r_k$. For detecting a quinary detection signal, a comparison with 4 reference values is necessary. There is then assumed that reference values $V-3, V-1, V1$ and $V3$ are used in the detection means 14, which are equal to $-3, -1, +1, +3$, respectively. For an equal likelihood of symbols $a_k$, the optimum value w is equal to 1. The relationship between detection signal and detected symbol value will be given in the Table below:

| $r_k$ | $â_k$ |
|---|---|
| $r_k < -3$ | $-4$ |
| $-3 \leq r_k < -1$ | $-2$ |
| $-1 \leq r_k < +1$ | $0$ |
| $+1 \leq r_k < +3$ | $+2$ |
| $+3 \leq r_k$ | $+4$ |

The value w is determined adaptively from the detection signal $r_k$ and the associated value of the destination symbol $â_k$. This may be done, for example, in accordance with the following expression:

$$w_{k+1}=w_k-\lambda(r_k-â_k)\cdot\text{SIGN}(â_k) \quad (2)$$

In (2), X is an adaptation constant determining the adaptation rate. If the value w is much lower than 0.25, this means that the absolute value $r_k$, when discarding the noise signal $n_k$, will always be smaller than 1 so that the symbol $â_k$ is always equal to 0. (2) and (1) show that w is then adapted only on the basis of the noise signal value $n_k$. Since the average value of the noise term $n_k$ is usually zero, the average value of the adaptation signal $\lambda(r_k-â_k)\cdot\text{SIGN}(â_k)$ will be zero, as a result of which w will not change. The result is a large symbol error rate which will not improve any more. Such a situation may be detected by the monitoring means 16 since the symbol values ±2 and ±4 no longer occur. By increasing, in such a situation, the value w in accordance with the inventive idea until all the symbol values again occur, it is possible yet to obtain a correct adaptation of w with too small an initial value w.

Another undesired situation occurs if two different absolute values of the detection signal lie above the maximum reference value. This can only occur if w is too high. In such a situation, two different levels of the detection signal will be shown on the same symbol value. If the constant w is adapted, an adaptation signal for reducing w will be generated for the higher of the two levels of the detection signal $r_k$, whereas for the lower of the two levels of the detection signal $r_k$, an adaptation signal could be generated to increase w. Since the two levels occur with a certain probability, w will one time be reduced and increased the next time. The value w is then controlled to an erroneous value which depends on the probability of the two levels of the detection signal.

For example, if the initial value w is assumed to be greater than 1.5, the absolute value of the highest level of the detection signal is greater than 6 and the absolute value of the all but highest level of the detection signal is greater than 3. For the two levels of the detection signal, the corresponding symbol $â_k$ is equal to ±4. For the higher of the two levels of the detection signal, the adaptation signal is equal to $\lambda(4w-4)$, whereas for the lower of the two levels of the detection signal, the adaptation signal is equal to $\lambda(4-2w)$. An equilibrium value w is then obtained for which the following relationship holds:

$$(4\cdot w-4)Pa_k=\pm4=(4-2\cdot w)Pa_k=\pm2 \quad (3)$$

For an equal likelihood of the different levels of the detection signal, this leads to a value w=1.6667. Here too the result is that a large symbol error rate occurs which will not improve any more. Such a situation can be detected by the monitoring means 16 in that the symbol values ±2 no longer occur. By reducing w according to the inventive idea, in such a situation, until all the symbol values start occurring again, it is possible yet to obtain a correct adaptation of w with too large an initial value w.

The sum of the adaptation signal and the correction signal, which sum is available on the output of the adder circuit 20, is integrated by the integrator 22 in a control signal for the AGC amplifier 12. Due to the presence of the integrator, the gain of the AGC amplifier 12 is controlled so that both the adaptation signal and the correction signal become equal to zero. It will be evident that the integrator 22 can be constructed with both analog means and digital means.

There should be observed that, in order to obtain a correct ratio between the amplitude of the detection signal and the reference values, it is alternatively possible to control the reference values in lieu of controlling the gain of the AGC amplifier. The reference value V1 may then, for example, be derived from:

$$V1_{k+1}=V1_k+\lambda(r_k-V1_k\cdot â_k)\cdot â_k \quad (4)$$

The other reference values can then be simply derived from the reference value V1 by multiplication by a constant value.

Figure 2:
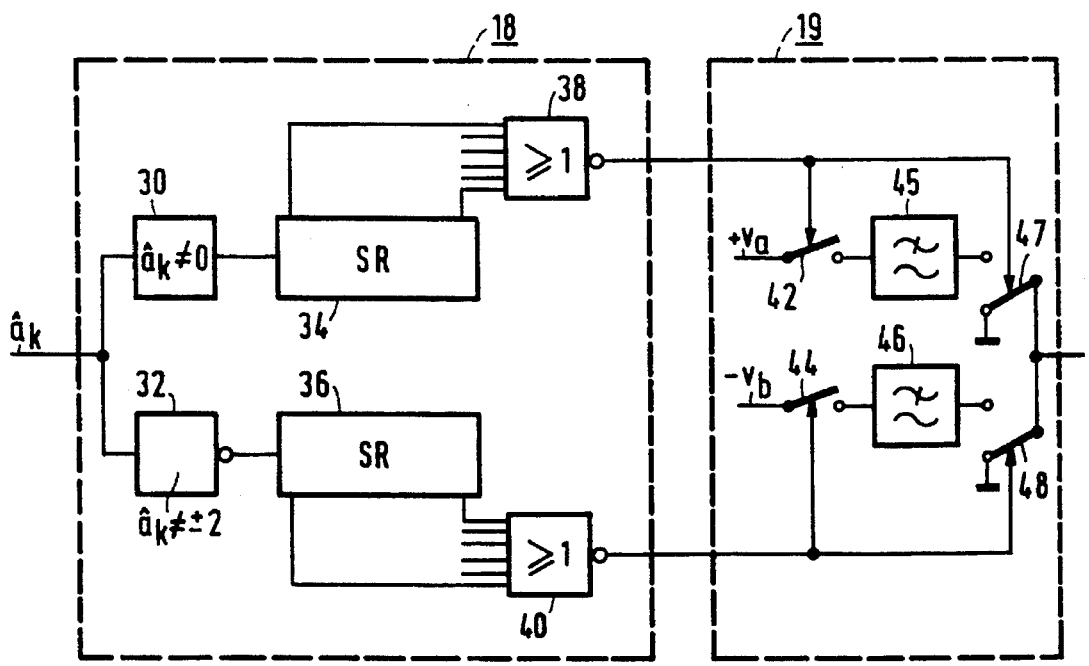
FIG. 2 shows a combination of monitoring means and correction means according to the inventive idea.

In the combination of the monitoring means 18 and the correction means 19 shown in FIG. 2, the detected symbols $â_k$ are applied to comparing circuits 30 and 32. The output of the comparing circuit 30 [32] is connected to an input of a shift register 34 [36]. A number of parallel outputs of the shift register 34 [36] are connected to inputs of a NOR gate 38 [40]. The output of the NOR gate 38 [40] is connected to a control input of a switch 42 [44] and of a change-over switch 47 [48]. A first contact of the switch 42 [44] is connected to a positive [negative] voltage source which carries a voltage $V_a$ [$V_b$]. A second contact of the switch 42 [44] is connected to an input of a low-pass filter 45 [46]. The output of the low-pass filter 45 [46] is connected to a first contact of the change-over switch 47 [48]. A second contact of the change-over switch 47 [48] is connected to a point of reference potential. The central contact of the changeover switch 47 [48] is connected to the output of the correction means where the correction signal is available.

The comparing circuit 30 [32] ascertains whether the value of the symbol $â_k$ is unequal to [±2]. If the value $â_k$ is unequal to 0 [±2], the output of the comparing circuit has the logic "1" value ["0"]. If the value $â_k$ is equal to 0 [±2], the output signal of the comparing circuit has the logic "0" value ["1"]. Successive values of the output signal of the comparing circuit 30 [32] are shifted in the shift register 34 [36]. If the value w is too small [too large], all the output signals of the shift register 34 [36] will at a specific moment have a logic "0" value. As a result, the logic value of the output signal of the NOR gate 38 [40] becomes equal to "1", so that the switch 42 [44] is closed and the change-over switch 47 [48] is turned. A correction signal $v_a'[v_b']$ will then be available on the output of the correction circuit 19 to correct the value w. The low-pass filter 45 [46] causes the value of the correction signal to increase relatively slowly, while the change-over switch 47 [48] causes the correction signal to become zero immediately if again symbols $â_k$ are detected having a symbol value unequal to 0 [equal to ±21].

The signs of the voltages $v_a$ and $v_b$ are opposite because this value is to be increased if the value w is too low, whereas this value is to be reduced if the value w is too high.

Figure 3:
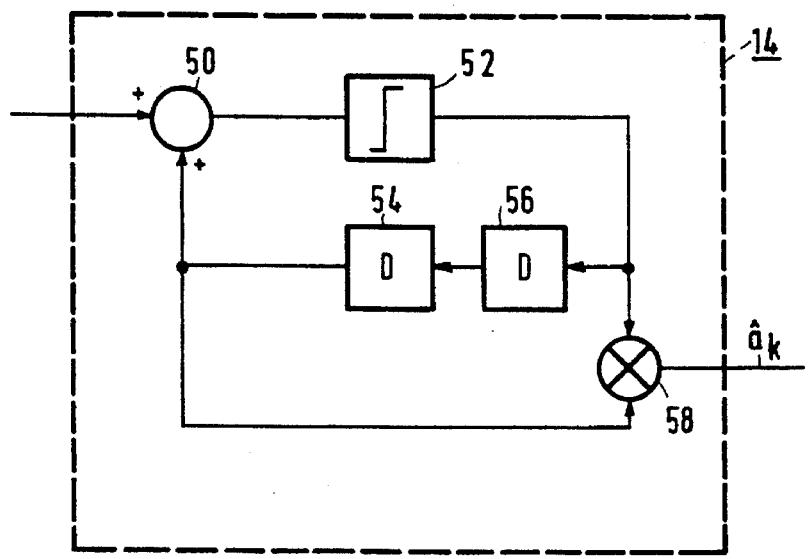
FIG. 3 shows an embodiment of a detector for detecting Partial Response class IV signals in which only the destination symbols are available.

In the detection means 14 shown in FIG. 3, the detection signal is applied to a first input of an adder circuit 50. An output of the adder circuit 50 is connected to an input of a comparator 52. The output of the comparator 52 is connected to an input of a cascade circuit comprising two delay elements 56 and 54 and to the input of a multiplier circuit 58. The output of the cascade circuit of delay elements 56 and 54 is connected to a second input of the adder circuit 50 and to a second input of the multiplier circuit 58.

Detection means, shown in FIG. 3, are intended to detect detection signals coming from a channel that has a commonly termed Class IV partial response transfer. This transfer is described by the transfer function $H(D)=1-D^2$, where D is the notation customary in data transmission for a delay over one symbol interval. A symbol to be transmitted is now converted to a first pulse, at a first instant, and a second pulse, as large as the first one but then having an opposite sign, at an instant two symbol intervals later than the first instant. The value of the detection signal then depends on the value of the transmitted symbol $a_k$ and of the value of the transmitted symbol $a_{k-2}$. In addition, precoding is usually applied by first converting the symbols $a_k$ to symbols $b_k = a_k \cdot b_{k-2}$. This precoding is often prescribed in a transmission or recording standard, so that simple receivers (not discussed here) can be used. A further advantage of precoding is that a sign inversion of the detection signal no longer has any effect on the value of the detected symbols $\hat{a}_k$. In the case of binary transmission, the dependence of the detection signal on the symbols to be transmitted will be given in the Table below.

| $a_k$ | $b_{k-2}$ | $b_k$ | detection signal |
|---|---|---|---|
| −1 | −1 | +1 | +2 |
| −1 | +1 | −1 | −2 |
| +1 | −1 | −1 | 0 |
| +1 | +1 | +1 | 0 |

The detection means 16 make a decision about the sign of the output signal of the comparator 52 at the instant k-2 and the detection signal at the instant k. The functioning of the combination of adder circuit 50, comparator 52 and delay elements 54 and 56 corresponds to the functioning of a decision feedback equalizer, while an estimate of the intersymbol interference caused by the symbol $\hat{b}_{k-2}$ is eliminated by adding, to the detection signal, a feedback value proportional to the symbol $\hat{b}_{k-2}$. It will be evident that here only a binary decision about the symbol $b_k$ is made by the comparator 52, whereas the input signal is trinary. The multiplier circuit 58 determines the value of the symbol $\hat{a}_k$ from the values $\hat{b}_k$ and $\hat{b}_{k-2}$.

If the value w is too low, the value $\hat{b}_k$ will always be the same (+1 or −1) or alternately adopt the values +1 and −1, depending on the initial contents of the delay elements 54 and 56. This will lead to the fact that the value $\hat{a}_k$ is always equal to +1. This fact may be utilized for generating the correction signal. The method mentioned above not only can be used for the PRIV channel discussed hereinbefore, but also for EPRIV channels. For and EPRIV channel having precoding, the following hold for the transmitted channel symbols $b_k$:

$$b_k = a_k \oplus b_{k-1} \oplus b_{k-2} \oplus b_{k-3} \quad (5)$$

where $\oplus$ represents a modulo-2 addition. For this channel the possible values $r_k$, with w=1, are equal to −4, −2, 0, +2 and +4. The relationship the values $r_k$ and the values $\hat{b}$ and $\hat{a}$ will be given in the following Table

| $r_k$ | $\hat{b}_{k-3}$ | $\hat{b}_{k-2}$ | $\hat{b}_{k-1}$ | $\hat{b}_k$ | $\hat{a}_k$ |
|---|---|---|---|---|---|
| 0 | +1 | +1 | +1 | +1 | −1 |
| 0 | −1 | +1 | −1 | +1 | −1 |
| 0 | +1 | −1 | −1 | +1 | −1 |
| 0 | −1 | +1 | +1 | −1 | −1 |
| 0 | +1 | −1 | +1 | −1 | −1 |
| 0 | −1 | −1 | −1 | −1 | −1 |
| +2 | −1 | +1 | +1 | +1 | +1 |
| +2 | +1 | −1 | +1 | +1 | +1 |
| +2 | −1 | −1 | −1 | +1 | +1 |
| +2 | −1 | −1 | +1 | −1 | +1 |
| −2 | +1 | −1 | −1 | −1 | +1 |
| −2 | −1 | +1 | −1 | −1 | +1 |
| −2 | +1 | +1 | −1 | +1 | +1 |
| −2 | +1 | +1 | +1 | −1 | +1 |
| +4 | −1 | −1 | +1 | +1 | −1 |
| −4 | +1 | +1 | −1 | −1 | −1 |

If the value w is too small, the detection signal will always be observed as a signal level equal to 0. This means that the value $\hat{a}$ will then always be represented as −1. The fact that only the value −1 occurs for $\hat{a}_k$ here means that w is too small and is to be increased. If the value w is too high, the detection signal will be considered to have a value of −4, 0 or +4, which values are then also represented as $\hat{a}_k = -1$. However, this calls for a reduction of w. To solve this problem, it is possible for the detection of values $\hat{a}_k$, which are only equal to −1, first to reduce the value w considerably, so that it is certainly too low, and then increase this value w step by step until all the values $\hat{a}_k$ again occur.

Figure 4:
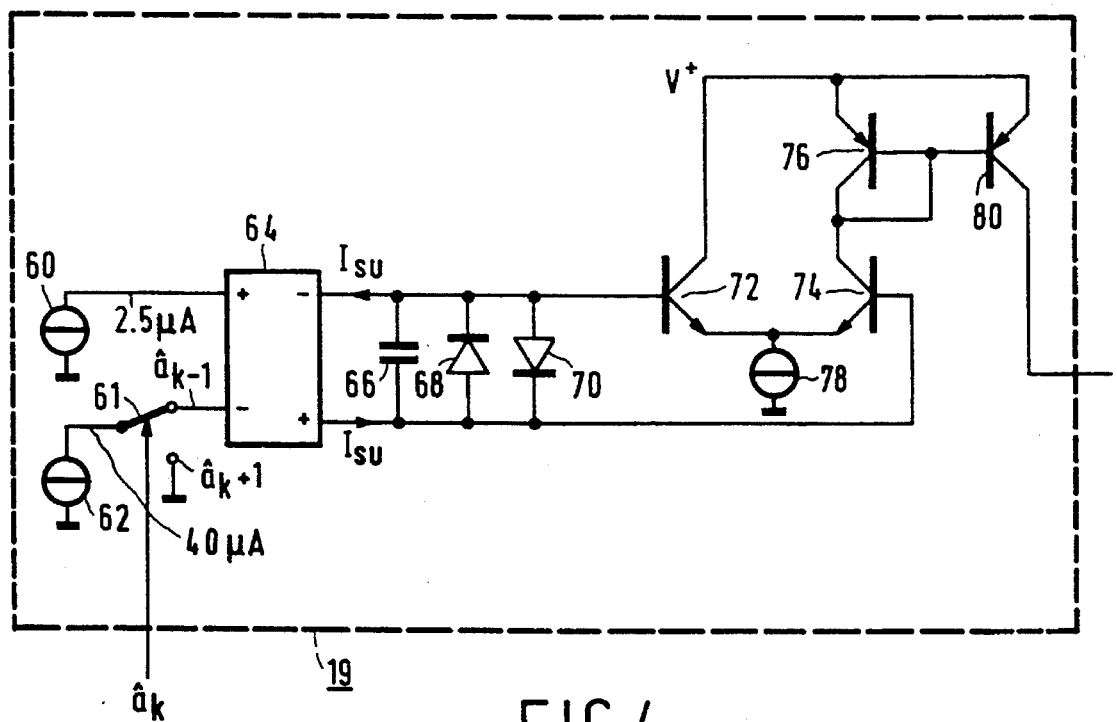
FIG. 4 shows correction means to be used in a receiver comprising the detection means shown in FIG. 3.

In the correction circuit shown in FIG. 4, a relatively small current ($\approx$2.5 μA) is applied to a positive input of a subtracter circuit 64. A relatively large current ($\approx$40 μA) is applied via a switch 61 to a negative input of the subtracter circuit 64. A first output of the subtracter circuit 64 is connected to a first terminal of a capacitor 66, to the cathode of a diode 68, to the anode of a diode 70 and to the base of a transistor 72. A second output of the subtracter circuit 64 is connected to a second terminal of a capacitor 66, to the anode of the diode 68, to the cathode of the diode 70 and to the base of a transistor 74. The emitters of the transistors 72 and 74 are connected to a current source 78. The collector of the transistor 72 is connected to a positive supply voltage V+. The collector of the transistor 74 is connected to the base and the collector of a transistor 76, and to the base of a transistor 80. The emitters of the transistors 76 and 80 are connected to the supply voltage V+, whereas the collector of the transistor 80 forms the output of the correction means.

If the symbol values +1 and −1 frequently occur for the symbol $\hat{a}_k$, the switch 61 will be frequently turned. Since the average value of the current applied to the negative input of the subtracter circuit is greater than the current applied to the positive input, on avenge a negative current will be delivered by the subtracter circuit. As a result, the capacitor 66 will be charged up to the forward voltage of the diode 70, so that the voltage on the base of the transistor 72 is larger than the voltage on the base of transistor 74. As a result, the current coming from the current source 78 will mainly flow through transistor 72, so that the output current of the correction circuit is substantially zero.

However, if the value w is too low, only the value $\hat{a}_k = +1$ will occur and no current will be applied to the negative input of the subtracter circuit 64, and the output current of the subtracter circuit 64 will be positive, so that the capacitor 66 will be charged relatively slowly in opposite direction. Once the voltage across the capacitor has reached the forward voltage level of the diode 68, the voltage on the base of the transistor 74 is greater than the voltage on the base of transistor 72. Consequently, the current coming from the current source 78 will mainly flow through the transistor 74 and the current mirror formed by the transistors 76 and 80 will supply the correction signal in the form of a current. Since the value of the current produced by the current source 60 is relatively small, it will take some time before the capacitor 66 is charged, so that the correction signal will increase relatively slowly. However, once all the signal values $\hat{a}_k$ again occur, a much larger current will regularly be supplied to the negative input of the subtracter circuit by the current source 61, so that the capacitor 66 will be rapidly discharged and will be recharged in opposite direction. These measures achieve that the correction signal will rapidly diminish if all these symbol values $â_k$ again occur.

We claim:

1. Digital transmission system comprising a transmitter, to which source symbols are supplied, coupled by a channel to a receiver for supplying destination symbols, the receiver comprising deriving means for deriving a detection signal from an input signal received from the channel, and a detector for determined the destination symbols by comparing the detection signal with at least one reference value, the receiver also including adapting means for adapting the ratio between the amplitude of the detection signal and the reference value to minimize the symbol error rate, characterized in that the receiver comprises monitoring means for detecting the absence of at least one of the possible values of the destination symbols and includes correction values for correcting the ratio between the detection signal and the reference value if at least one of the possible values of the destination symbols is absent.

2. Transmission system as claimed in claim 1, characterized in that the receiver is arranged for adapting the ratio between the detection signal and the reference value on the basis of a combination of a correction signal coming from the correction means and an adaptation signal coming from the adapting means.

3. Transmission system as claimed in claim 1, characterized in that the correction means are arranged for generating a correction signal which, if at least one of the possible values of the destination symbols is absent, changes in a first direction at a rate that is lower than the rate at which the correction signal changes in a direction opposite to the first direction when all the possible values of the destination symbols occur.

4. Transmission system as claimed in claim 1, characterized in that said input signal from said channel includes channel symbols, and the number of possible values of the channel symbols is greater than the number of possible values of the source symbols, in that the detector determines destination symbols that have the same possible values as the source symbols from the detection signal, and in that the monitoring means are arranged merely for detecting the absence of possible values of the destination symbols.

5. Receiver for receiving an input signal representing digital symbols, the receiver comprising deriving means for deriving a detection signal from the input signal, and a detector for determining destination symbols by comparing the detection signal with at least one reference value, the receiver also including adapting means for adapting the ratio between the amplitude of the detection signal and the reference value to minimized a symbol error rate, characterized in that the receiver comprises monitoring means for detecting the absence of at least one of the possible values of the destination symbols and includes correction means for correcting the ratio between the detection signal and the reference value if possible values of the destination symbols are absent.

6. Receiver as claimed in claim 5, characterized in that the receiver is arranged for adapting the ratio between the detection signal and the reference value on the basis of a combination of a correction signal coming from the correction means and an adaptation signal coming from the adapting means.

7. Receiver as claimed in claim 5, characterized in that the correction means are arranged for generating a correction signal which, if at least one of the possible values of the destination symbols is absent, increases at a rate that is lower than a rate at which the correction signal diminishes when all the possible values of the destination symbols occur.

8. Receiver as claimed in claim 5, characterized in that said input signal includes channel symbols, and the number of possible values of the channel symbols is greater than the number of possible values of the source symbols, in that the detector determines destination symbols that have the same possible values as the source symbols from the detection signal and in that the monitoring means are arranged for detecting the absence of possible values of the destination symbols.

* * * * *